United States Patent [19]
Arai

[11] 3,947,761
[45] Mar. 30, 1976

[54] PEAK LEVEL INDICATOR
[75] Inventor: Michio Arai, Tokyo, Japan
[73] Assignee: Sony Corporation, Tokyo, Japan
[22] Filed: Aug. 21, 1974
[21] Appl. No.: 499,264

Related U.S. Application Data
[63] Continuation-in-part of Ser. No. 373,731, June 26, 1973, Pat. No. 3,868,718.

[30] Foreign Application Priority Data
Aug. 25, 1973 Japan.................. 48-95389

[52] U.S. Cl................. 324/103 P; 357/14; 357/22
[51] Int. Cl.²................... G01R 19/16; H01L 11/00
[58] Field of Search........... 324/103 P, 102; 357/22, 357/14

[56] References Cited
UNITED STATES PATENTS
3,753,109   8/1973   Schainbaum.................. 324/103 P
3,761,185   9/1973   Blackwell.................. 324/103 P Primary Examiner—R. V. Rolinec
Assistant Examiner—Ernest F. Karlsen
Attorney, Agent, or Firm—Hill, Gross, Simpson, Van Santen, Steadman, Chiara & Simpson

[57] ABSTRACT

A peak level indicator using a field effect transistor having a semiconductive substrate with a current path portion, first and second semiconductive regions forming a PN junction therebetween, the first region being capacitively coupled to the current path portion to form a capacitor, and a rectified input signal being applied to the second region. The peak level indicator is provided with a level meter indicating a current through the current path portion.

13 Claims, 15 Drawing Figures

PEAK LEVEL INDICATOR

CROSS-REFERENCES TO RELATED APPLICATIONS

This application is a continuation-in-part application of my copending application Ser. No. 373,731, now Pat. No. 3,868,718, filed June 26, 1973.

BACKGROUND OF THE INVENTION

1. Field of the Invention:

This invention relates to a peak level indicator in which a peak level of an electric signal with various levels is indicated by a level-indicating meter, a level-indicating lamp or the like.

2. Description of the Prior Art:

The conventional peak level indicator of this type or the so-called peak meter is provided with a time constant circuit whose rise time is short and whose fall time is long. For instance, in the generally known BBC method, the rise time is about 10 milliseconds and the fall time is about 3 seconds. And in the DIN method, the rise time is about 1 to 10 milliseconds and the fall time is about 2 seconds.

However, in such time-constant circuits, a special memory capacitor is required for storage of electric charge. Therefore, it is difficult to form an integrated circuit for the time-constant circuit. Moreover, since it is difficult to vary arbitrarily and widely the time constant for the blanking of the stored charge, it is difficult to indicate the peak level in the wide range of frequencies. The distortion is apt to occur.

SUMMARY OF THE INVENTION

An object of this invention is to provide a peak level indicator which is simple in construction, which requires no special memory capacitor and therefore which is easy to be integrated.

Another object of this invention is to provide a peak level indicator which can indicate peak levels of electric signals in a wide range of frequencies.

A further object of this invention is to provide a peak level indicator in which an output is less distorted.

A still further object of this invention is to provide a peak level indicator using a novel semiconductor device.

In accordance with an aspect of this invention, a peak level indicator comprises:

a. a semiconductor device including a semiconductive substrate with a current path portion, first and second semiconductive regions forming a PN junction therebetween, said first region being capacitively coupled to said current path portion, and a control electrode connected to said second region;

b. means for applying a current through said current path portion;

c. an indicating means for indicating said current through said current path portion; and d. means for applying an input signal to said control electrode.

The above and other objects, features and advantages of the invention will be apparent in the following detailed description of illustrative embodiments thereof which is to be read in connection with the accompanying drawings.

DESCRIPTION OF THE PREFERRED EMBODIMENTS

First, one embodiment of this invention will be described with reference to FIG. 1-FIG. 4.

Figure 1:
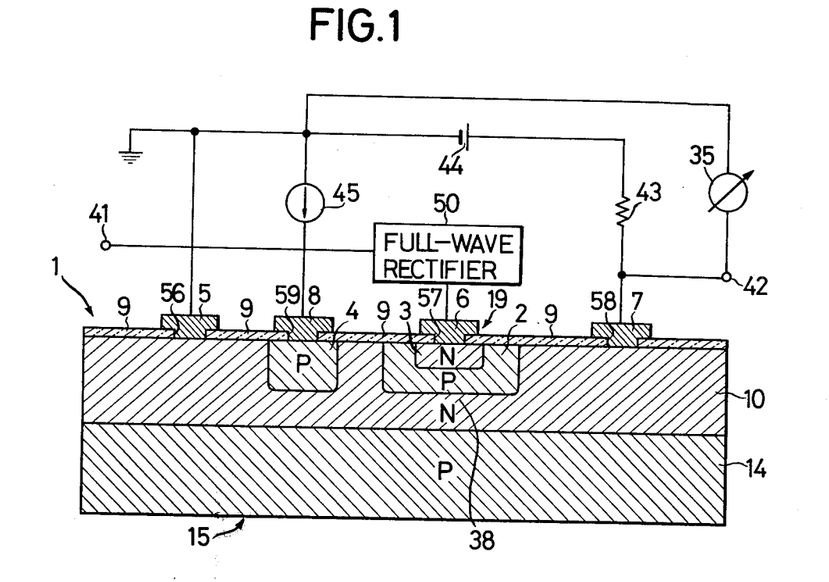
FIG. 1 is a schematic cross-sectional view of a semiconductor device for a peak meter according to one embodiment of this invention.

In FIG. 1, a semiconductor device 1 comprises a charge storage junction type field effect transistor 19 (hereafter called CSJ FET). An N-type semiconductor region 10 is deposited on a P-type semiconductive region 14 as a semiconductive substrate 15 by the epitaxial growth method. A P-type semiconductive region 2 as a gate region is formed in the N-type semiconductive region 10 by the diffusion method.

The conventional lateral junction type field effect transistor is formed as above mentioned. In the semiconductor device 1, an N-type semiconductive region 3 is formed in the P-type semiconductive region 2 by the diffusion method. A PN junction is formed between the P-type semiconductive region 2 and the N-type semiconductive region 3. A P-type semiconductive region 4 is formed in the N-type semiconductive region 10 by the diffusion method. The P-type semiconductive region 4 functions as an emitter region for injecting carriers.

An insulating layer 9 made of $SiO_2$ is deposited on the N-type semiconductive region 10. Openings 56, 57 and 58 made in the insulating layer 9 are closed by a source electrode 5, a gate electrode 6 and a drain electrode 7, respectively. Moreover, an opening 59 made in the insulating layer 9 is closed by an emitter electrode 8.

The gate electrode 6 is connected to an input terminal 41 through a full-wave rectifier 50. The source electrode 5 is connected to the ground. The drain electrode 7 is connected to the ground through a resistor 43 and a DC power source 44 whose negative terminal is connected to the ground. The emitter electrode 8 is connected to a current source 45. An output terminal 42 is connected to a connecting point of the drain electrode 7 and the resistor 43. A meter 35 is connected to the output terminal 42.

Next, operations of the semiconductor device of FIG. 1 will be described with reference to FIG. 2A-FIG. 2D.

Figure 2A:
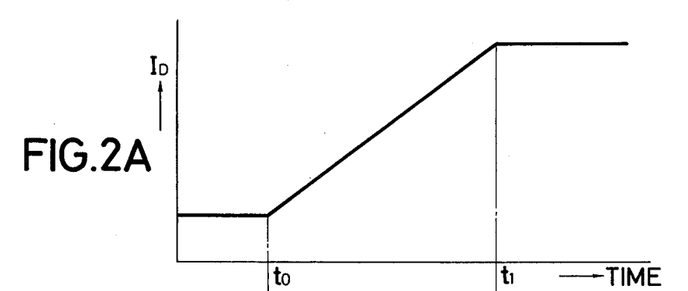
FIG. 2A is a graph showing a drain current of a CSJ FET of the semiconductor device shown on FIG. 1.
Figure 2B:
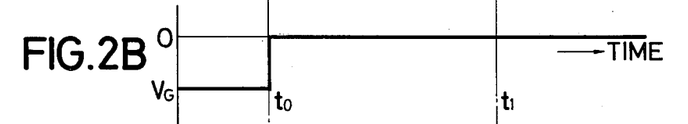
FIG. 2B is a graph showing a gate voltage of the CSJ FET of the semiconductor device shown on FIG. 1.

Presuming that the full-wave rectifier 50 is not provided, a gate voltage $V_G$ shown on FIG. 2B is applied to the gate electrode 6 to put the gate electrode 6 into a negative potential. Accordingly, the PN junction between the N-type semiconductive region 3 and the P-type semiconductive region 2 is forward-biased, while the PN-junction between the P-type semiconductive region 2 and the N-type semiconductive region 10 is reverse-biased. The whole of the gate voltage $V_G$ is applied across the PN junction between the P-type semiconductive region 2 and the N-type semiconductive region 10, so that a depletion layer is spread adjacent to the PN junction between the P-type semiconductive region 2 and the N-type semiconductive region 10. With the spread of the depletion layer, a lateral channel 38 extending from the source electrode 5 to the drain electrode 7 is narrowed and so a resistance between the source electrode 5 and the drain electrode 7 is increased. The source-drain voltage $V_{SD}$ obtained from the output terminal 42 is increased with the resistance of the channel. The operations of the conventional junction field effect transistor (hereafter called J-FET) are substantially the same as the above-mentioned, which are illustrated by FIG. 2A-FIG. 2D. The gate voltage $V_G$ continues to be applied till time $t_o$. Since the resistance $R_{SD}$ of the channel is higher, the drain current $I_D$ (FIG. 2A) is lower and the source-drain voltage $V_{SD}$ (FIG. 2D) is higher.

Figure 2C:
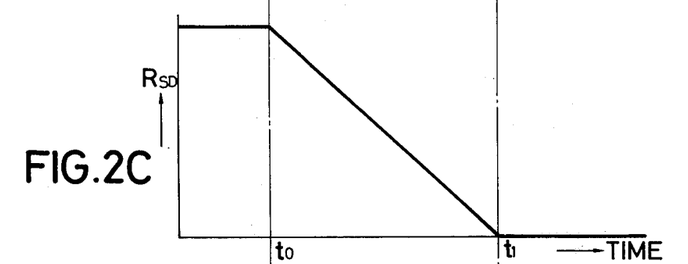
FIG. 2C is a graph showing a source-drain resistance of the CSJ FET of the semiconductor device shown on FIG. 1.
Figure 2D:
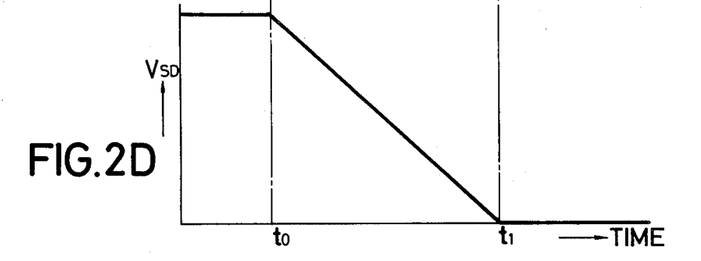
FIG. 2D is a graph showing a source-drain voltage of the CSJ FET of the semiconductor device shown on FIG. 1.

After the gate voltage becomes zero at the time $t_o$, the PN junction between the N-type semiconductive region 3 and the P-type semiconductive region 2 is reversed-biased. Accordingly, the channel resistance $R_{SD}$ between the source region and the drain region remains higher due to the electric field from the negative charge stored in the P-type semiconductive region 2, if holes as minority carriers are not injected from the P-type semiconductive region 4. However, since holes are injected into the N-type semiconductive region 10 from the P-type semiconductive region 4 by the current source 45, a constant current of the holes reaches the depletion layer formed due to the electric field from the negative charge stored in the P-type semiconductive region 2. The holes are recombined with the negative charge. Accordingly, the depletion layer is gradually narrowed and the channel resistance $R_{SD}$ between the source region and the drain region is nearly linerary decreased (FIG. 2C). In accordance with the channel resistance $R_{SD}$, the drain current $I_D$ is nearly linerary increased (FIG. 2A). The source-drain voltage $V_{SD}$ is nearly linerary decreased (FIG. 2D).

Time constants for the decrease of the channel resistance $R_{SD}$ and the increase of the drain current $I_D$ can be varied with the intensity of the current from the current source 45. Thus, CSJ FET has the pulse response characteristics that the rise time is short and that the fall time is long. The time constant for the fall time can be easily varied.

Figure 3:
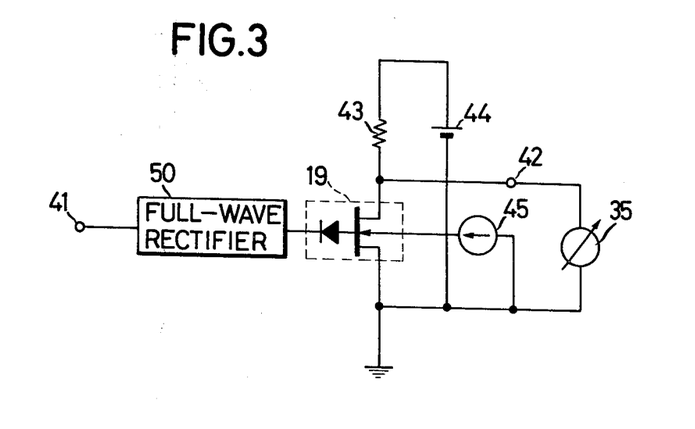
FIG. 3 is a circuit representation of the semiconductor device shown on FIG. 1.

Next, operations of the peak meter comprising the semiconductor device 1 of FIG. 1 will be described with reference to FIG. 3 and FIG. 4A to FIG. 4E. FIG. 3 is a circuit representation of the semiconductor device 1 of FIG. 1. Parts in FIG. 3 which correspond with the parts in FIG. 1 are denoted by the same reference numerals, which will not be described in detail.

Figure 4A:
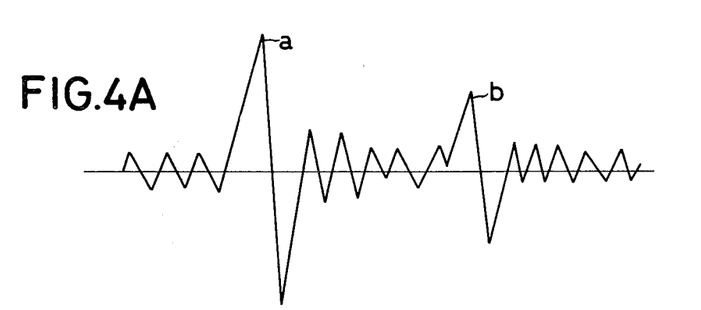
FIG. 4A is a wave diagram of a random analog signal applied to an input terminal of the semiconductor device shown on FIG. 1.

When a random analog signal (FIG. 4A) including peak voltage a and b is applied to the input side of the full-wave rectifier 50 from the input terminal 41, a full-wave rectified signal (FIG. 4B) including peak voltages c and d can be obtained from the output side of the full-wave rectifier 50. The values of the peak voltages c and d are proportional to those of the peak voltages a and b. When the signal of FIG. 4B is applied directly to the meter, the meter cannot follow the rapid change of the level, since the response of the meter is slow. Accordingly, the meter cannot exactly indicate the peak voltages a and b (FIG. 4E). However, in this invention, the signal of FIG. 4B is applied to the meter through the CSJ FET. Since the CSJ FET has the pulse response characteristics that the rise time is short and that the fall time is long, an input signal with rapid changes of levels can be converted into a signal with such slow changes of levels that even the meter with the slow response can follow.

Figure 4B:
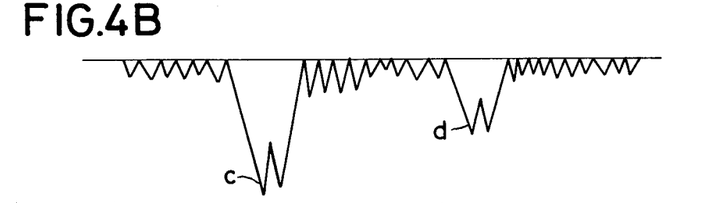
FIG. 4B is a wave diagram of the analog signal of FIG. 4A, rectified by a full-wave rectifier shown on FIG. 1.
Figure 4C:
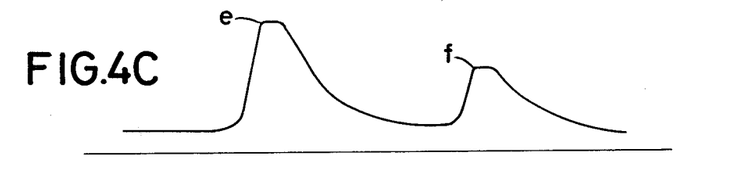
FIG. 4C is a wave diagram of an output of the semiconductor device shown on FIG. 1.
Figure 4D:
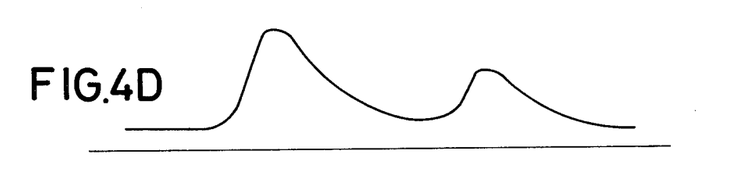
FIG. 4D is a graph showing an indicating value of a peak meter shown on FIG. 1.
Figure 4E:
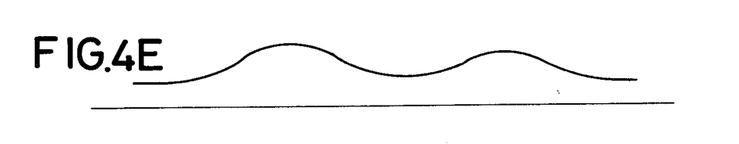
FIG. 4E is a graph showing an indicating value of the peak meter when the full-wave rectified analog signal of FIG. 4B is applied directly to the peak meter.

When the signal of FIG. 4B including the peaks c and d is applied to the gate electrode 6 of the CSJ FET 19, the sawtoothed voltage as the source-drain voltage is obtained from the output terminal 42 (FIG. 4C). The saw-toothed voltage rises rapidly and falls slowly, due to the charge storage effect of the CSJ FET. The time constant for falling is decided by the intensity of the current from the current source 45 which supplies the holes injected from the P-type semiconductive region 4 as the emitter region. When the semiconductor device 1 of FIG. 1 is used in the BBC method, the time constant for falling is set to about 3 seconds. And when the semiconductor device 1 of FIG. 1 is used in the DIN method, the time constant for falling is set to about 2 seconds. When no hole is injected from the P-type semiconductive region 4, the time constant for falling is about 3 seconds. Therefore, the current source 45 need not be connected to the emitter electrode 8 in the BBC method. The CSJ FET without the emitter region 4 can be used in the BBC method.

As above mentioned, the random signal of FIG. 4A is converted into the full-wave rectified signal of FIG. 4B by the full-wave rectifier 50. When the full-wave rectified signal is applied to the gate electrode 6 of the CSJ FET, the signal (FIG. 4C) with the slow change of the levels can be obtained from the drain electrode 7 of the CSJ FET. Thus, the signal with the rapid change of the levels including the peaks a and b can be converted into the signal with the slow change of the levels including the peaks e and f. The values of the peak voltages e and f are proportional to those of the peak voltages a and b. Consequently, the meter 35 indicates the peak voltages as shown on FIG. 4D, with the application of the signal of FIG. 4C to the meter 35.

In the above embodiment, the negative charge stored in the P-type semiconductive region 2 is neutralized with the injection of the holes as the minority carriers from the P-type semiconductive region 4 as the emitter.

It may be neutralized with the irradiation of light, instead of the injection of the carriers. The PN junction between the P-type semiconductive region 2 as the gate region and the N-type semiconductive region 10, is reverse-biased with the negative charge stored in the P-type semiconductive region 2. When light is irradiated onto the upper surface of the semiconductor device 1, carriers (electrons and holes) are generated in a transition region, namely the depletion layer to increase reverse currents, so that the negative charge stored in the P-type semiconductive region 2 is neutralized.

Next, another embodiment of this invention will be described with reference to FIG. 5.

Figure 5:
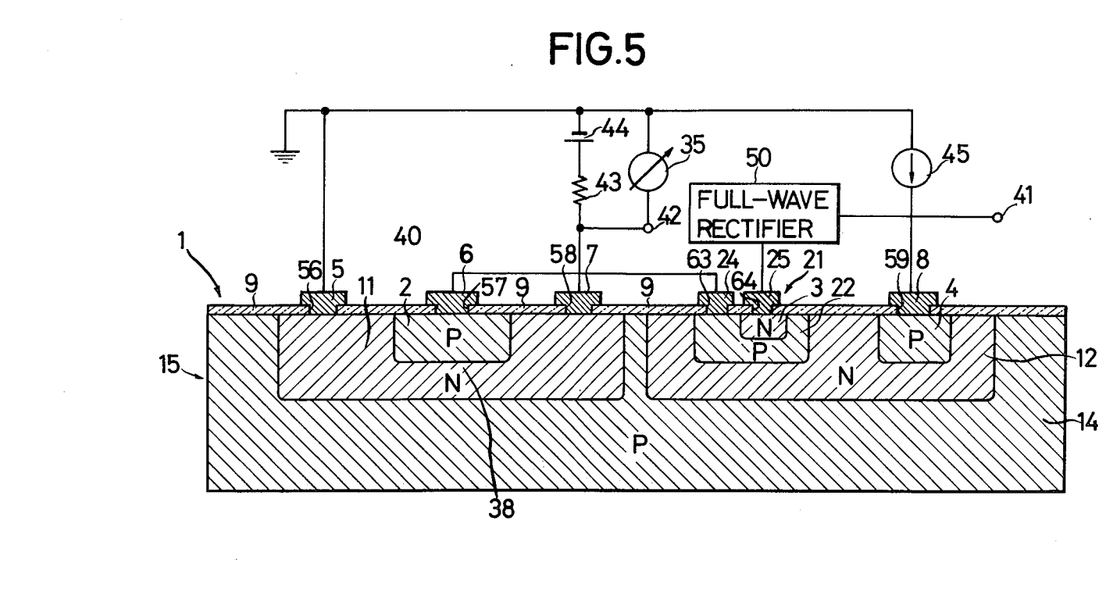
FIG. 5 is a schematic cross-sectional view of a semiconductor device for a peak meter according to another embodiment of this invention.

Parts in FIG. 5 which correspond with the parts in FIG. 1, are denoted by the same reference numerals, which will not be described in detail.

In the semiconductor device 1 shown on FIG. 5, islandlike N-type semiconductive regions 11 and 12 are formed in the P-type semiconductive region 14 by the diffusion method. Moreover, the P-type semiconductive regions 2 and 4, and another P-type semiconductive region 22 are formed in the N-type semiconductive regions 11 and 12, respectively by the diffusion method. The N-type semiconductive region 3 is formed in the P-type semiconductive region 22 by the diffusion method. The insulating layer 9 made of $SiO_2$ is deposited on the upper surface of the P-type semiconductive region 14. The openings 56, 57 and 58 made in the insulating layer 9 are closed by the source electrode 5, the gate electrode 6 and the drain electrode 7, respectively. Moreover, openings 63, 64 and 59 made in this insulating layer 9 are closed by an anode electrode 24, a cathode electrode 25 and the emitter electrode 8, respectively.

A J-FET 40 is formed in the N-type semiconductive region 11. A diode 21 and the P-type semiconductive region 4 are formed in the N-type semiconductive region 12. The P-type semiconductive region 4 functions as an emitter for injecting carriers which neutralize the charge stored in the P-type semiconductive region 22 of the diode 21. The gate electrode 6 of the J-FET 40 is connected to the anode electrode 24 of the diode 21. Accordingly, this semiconductor device 1 operates in the same manner as the afore-mentioned CSJ FET. Since the charge stored in the P-type semiconductive region 22 of the diode 21 is neutralized with the injection of the carriers from the P-type semiconductive region 4, this semiconductor device 1 operates in the same manner as the one embodiment of FIG. 1.

In the diode 21 of the semiconductor device 1 shown on FIG. 5, the cathode electrode 25 is connected to the input terminal 41 through the full-wave rectifier 50 and the anode electrode 24 is connected to the gate electrode 6 of the J-FET 40. In the J-FET 40, the source electrode 5 is connected directly to the ground, and the drain electrode 7 is connected to the ground through the resistor 43 and the DC power source 44 whose negative terminal is connected to the ground. The emitter electrode 8 is connected to the ground through the current source 45. The output terminal 42 is connected to the connecting point of the drain electrode 7 and the resistor 43. The meter 35 is connected to the output terminal 42.

Next, operations of the semiconductor device of FIG. 5 will be described with reference to FIG. 2A-FIG. 2D.

Presuming that the full-wave rectifier 50 is not provided, the gate voltage $V_G$ shown on FIG. 2B is applied to the cathode electrode 25 to put the cathode electrode 25 into the negative potential. Accordingly, the PN junction between the N-type semiconductive region 3 and the P-type semiconductive region 22 is forward-biased, while the PN-junction between the P-type semiconductive region 2 and the N-type semiconductive region 11 is reverse-biased. Accordingly, the whole of the gate voltage $V_G$ is applied across the PN junction between the P-type semiconductive region 2 and the N-type semiconductive region 11, so that the depletion layer is spread adjacent to the PN junction between the P-type semiconductive region 2 and the N-type semiconductive region 11. With the spread of the depletion layer, the lateral channel 38 extending from the source electrode 5 to the drain electrode 7 is narrowed and so the resistance between the source electrode 5 and the drain electrode 7 is increased. The source-drain voltage $V_{SD}$ obtained from the output terminal 42 is increased with the resistance of the channel. The operations of the conventional J-FET are substantially the same as the above-mentioned, which are illustrated by FIG. 2A-FIG. 1D. The gate voltage $V_G$ continues to be applied till the time $t_o$. Since the resistance $R_{SD}$ of the channel is higher, the drain current $I_D$ (FIG. 2A) is lower and the source-drain voltage $V_{SD}$ (FIG. 2D) is higher.

After the gate voltage becomes zero at the time $t_o$, the PN junction between the N-type semiconductive region 3 and the P-type semiconductive region 22 is reverse-biased. Accordingly, the channel resistance $R_{SD}$ between the source region and the drain region remains higher due to the electric field from the negative charge stored in the P-type semiconductive regions 2 and 22, if the holes as minority carriers are not injected from the P-type semiconductive region 4. However, since the holes are injected into the N-type semiconductive region 12 from the P-type semiconductive region 4 by the current source 45. The holes are recombined with the negative charge stored in the P-type semiconductive regions 2 and 22. Accordingly, the depletion layer is gradually narrowed and the channel resistance $R_{SD}$ between the source region and the drain region is nearly linearly decreased (FIG. 2C). In accordance with the channel resistance $R_{SD}$, the drain current $I_D$ is nearly linearly increased (FIG. 2A). The source-drain voltage $V_{SD}$ is nearly linearly decreased (FIG. 2D).

The time constants for the decrease of the channel resistance $R_{SD}$ and the increase of the drain current $I_D$ can be varied with the intensity of the current from the current source 45. The CSJ FET comprising the J-FET 40 and the diode 21 has the pulse response characteristics that the rise time is short and that the fall time is long. The time constant for the fall time can be easily varied.

The operations of the peak meter comprising the semiconductor device 1 of FIG. 5 are substantially the same as those of the peak meter comprising the semiconductor device of FIG. 1.

In the above embodiment, the negative charge stored in the P-type semiconductive region 2 is neutralized with the injection of the holes as the minority carriers from the P-type semiconductive region 4 as the emitter. It may be neutralized with the irradiation of light, instead of the injection of the carriers. When light is irradiated onto the upper surface of the semiconductor device 1, carriers (electrons and holes) are generated in a transition region, namely the depletion layer to increase reverse currents, so that the negative charge stored in the P-type semiconductive region 2 is neutralized.

Next, a further embodiment of this invention will be described with reference to FIG. 6.

This embodiment is substantially the same as the embodiment of FIG. 5, except that the J-FET 40 is converted to a MOS FET 31, and that the conductivity type of the diode 21, the polarity of the current source 45, and the conductivity type of the P-type semiconductor region 4 are reversed.

Figure 6:
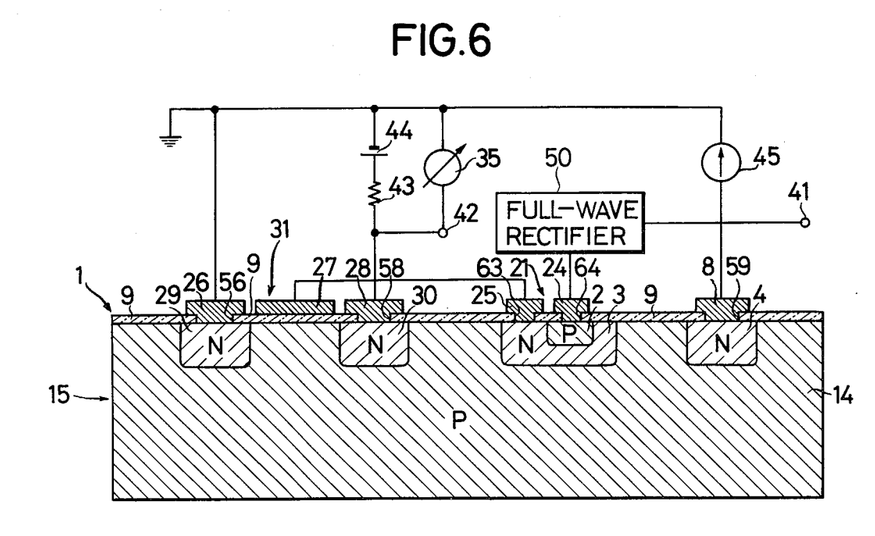
FIG. 6 is a schematic cross-sectional view of a semiconductor device for a peak meter according to a still another embodiment of this invention.

Parts in FIG. 6 which correspond with the parts of FIG. 5 are denoted by the same reference numerals, which will not be descrbied in detail.

In the semiconductor device 1 of FIG. 6, N-type semiconductor regions 3, 4, 29 and 30 are formed in the P-type semiconductive region 14, by the diffusion method. The N-type semiconductive regions 29 and 30 functions as the source region and the drain region of the MOS FET 31, respectively. A gate electrode 27 is formed on the insulating layer 9 between the N-type semiconductive regions 29 and 30.

The quantity and the decay of the storage charge of the MOS FET 31 can be controlled by the gate voltage $V_G$ supplied to the anode electrode 24 in such a manner as the semiconductor device 1 of FIG. 5.

Accordingly, operations of the peak meter comprising the semiconductor device 1 of FIG. 6 are substantially the same as those of the peak meter comprising the semiconductor device of FIG. 5.

In the above embodiment, the positive charge stored in the N-type semiconductive region 3 is neutralized with the injection of electrons as the minority carriers from the N-type semiconductive region 4 as the emitter. It may be neutralized with the irradiation of light, instead of the injection of the carriers.

Moreover in the above embodiments, the stored charge is neutralized with the carriers injected from the emitter region. However, it may be discharged through any discharging path.

Next, a still further embodiment of this invention will be described with reference to FIG. 7 and FIG. 8 in which a discharging path is provided for discharging the stored charge, instead of the emitter for injecting the carriers. In the semiconductor devices of FIG. 5 and FIG. 6, a discharging path may be provided instead of the emitter for injecting the carriers.

Figure 7:
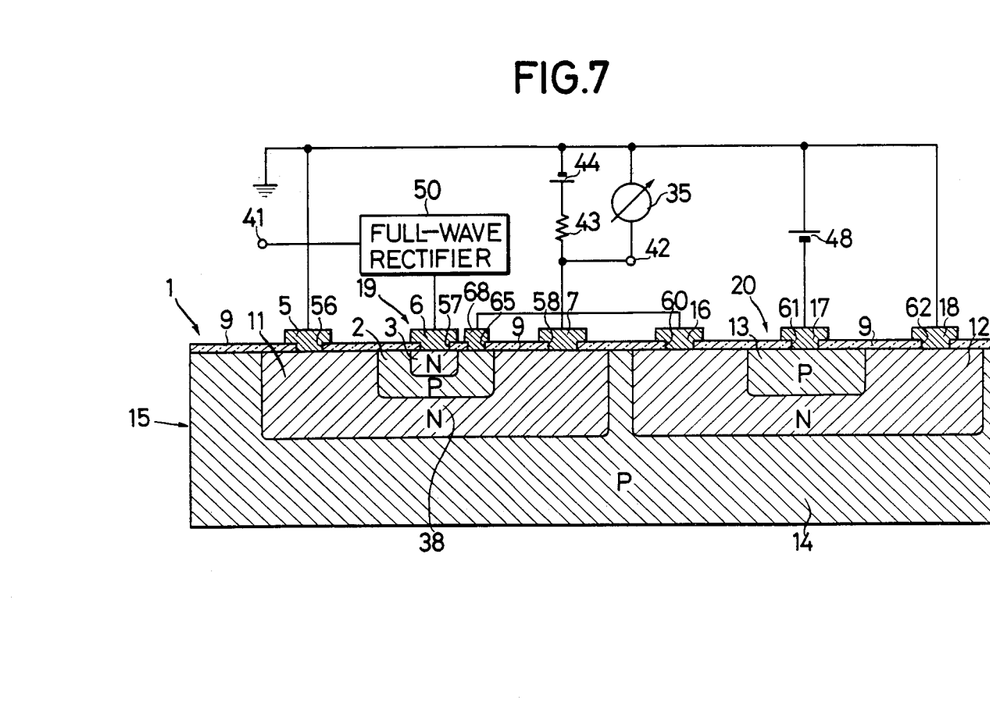
FIG. 7 is a schematic cross-sectional view of a semiconductor device for a peak meter according to a further embodiment of this invention.
Figure 8:
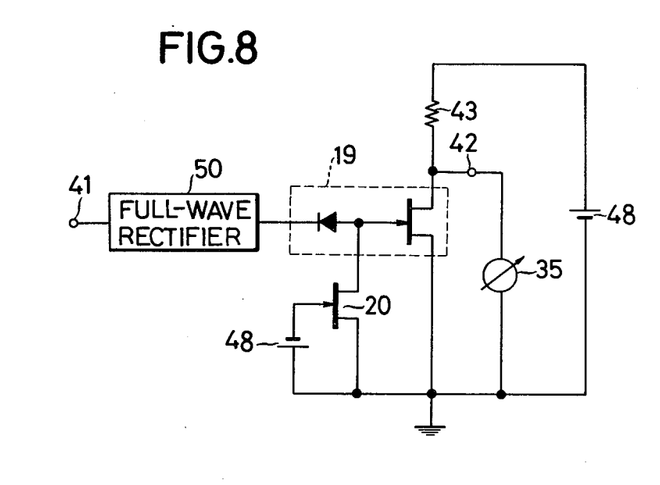
FIG. 8 is a circuit representation of the semiconductor device shown on FIG. 7.

Parts in FIG. 7 which correspond with the parts in FIG. 1, are denoted by the same reference numerals, which will not be described in detail.

In the semiconductor device 1 shown on FIG. 7, the island-like N-type semiconductive regions 11 and 12 are formed in the P-type semiconductive region 14 as the semiconductive substrate 15 by the diffusion method. Moreover, the P-type semiconductive region 2 and another P-type semiconductive region 13 are formed in the N-type semiconductive regions 11 and 12, respectively by the diffusion method. The N-type semiconductive region 3 is formed in the P-type semiconductive region 2 by the diffusion method. The insulating layer 9 made of $SiO_2$ is deposited on the upper surface of the P-type semiconductive region 14. The openings 56, 57 and 58 made in the insulating layer 9 are closed by the source electrode 5, the gate electrode 6 and the drain electrode 7, respectively. Moreover, openings 60, 61 and 62 made in the insulating layer 9 are closed by a drain electrode 16, a gate electrode 17 and a source electrode 18, respectively. And, an opening 65 made in the insulating layer 9 and facing to the P-type semiconductive region 2 is closed by an electrode 68 for discharging the stored charge. Thus, the CSJ FET 19 is formed in the N-type semiconductive region 11, while a J-FET 20 is formed in the N-type semiconductive region 12.

In the CSJ FET 19 of the semiconductor device 1 of FIG. 7, the gate electrode 6 is connected to the input terminal 41 through the full-wave rectifier 50, the source electrode 5 is connected directly to the ground, and the drain electrode 7 is connected to the ground through the resistor 43 and the DC power source 44 whose negative terminal is connected to the ground. The output terminal 42 is connected to the connecting point of the drain electrode 7 and the resistor 43. The meter 35 is connected to the output terminal 42. The electrode 68 for discharging the stored charge, connected to the P-type semiconductive region 2 of the CSJ FET 19 is connected to the drain electrode 16 of the J-FET 20. The gate electrode 17 of the J-FET 20 is connected to the ground through the DC power source 48 whose positive terminal is connected to the ground. The source electrode 18 of the J-FET 20 is connected directly to the ground.

Next, operations of the semiconductor device of FIG. 7 will be described with reference to FIG. 2A-FIG. 2D and FIG. 8.

Presuming that the full-wave rectifier 50 is not provided, the gate voltage $V_G$ shown on FIG. 2B is applied to the gate electrode 6 to put the gate electrode 6 into the negative potential. Accordingly, the PN junction between the N-type semiconductive region 3 and the P-type semiconductive region 2 is forward-biased, while the PN-junction between the P-type semiconductive region 2 and the N-type semiconductive region 11 is reverse-biased. The whole of the gate voltage $V_G$ is applied across the PN junction between the P-type semiconductive region 2 and the N-type semiconductive region 11, so that the depletion layer is spread adjacent to the PN junction between the P-type semiconductive region 2 and the N-type semiconductive region 11. With the spread of the depletion layer, the lateral channel 38 extending from the source electrode 5 to the drain electrode 7 is narrowed and so the resistance between the source electrode 5 and the drain electrode 7 is increased. The source-drain voltage $V_{SD}$ obtained from the output terminal 42 is increased with the resistance of the channel. The operations of the conventional J-FET are substantially the same as the above-mentioned, which are illustrated by FIG. 2A-FIG. 2D. The gate voltage $V_G$ continues to be applied till the time $t_o$. Since the resistance $R_{SD}$ of the channel is higher, the drain current $I_D$ (FIG. 2A) is lower and the source-drain voltage $V_{SD}$ (FIG. 2D) is higher.

After the gate voltage becomes zero at the time $t_o$, the PN junction between the N-type semiconductive region 3 and the P-type semiconductive region 2 is reverse-biased. If the negative charge stored in the P-type semiconductive region 2 of the CSJ FET 19 is not discharged through the source-drain of the J-FET 20, the channel resistance $R_{SD}$ of the CSJ FET 19 remains higher. However, a suitable voltage is applied to the gate electrode 17 of the J-FET 20 by the DC power source 48, so as to discharge the charge stored in the P-type semiconductive region 2. Accordingly, the charge is discharged from the source electrode 18 through the source-drain of the J-FET 20 in a nearly constant current. A time constant for the discharging can be varied with the voltage applied to the gate electrode 17 from the DC power source 48.

The depletion layer is gradually narrowed with the discharging. Accordingly, the channel resistance $R_{SD}$ of the CSJ FET 19 is substantially linearly decreased (FIG. 2C). And the drain current $I_D$ is substantially linearly increased (FIG. 2A). Thus, the CSJ FET has the pulse response characteristics that the rise time is short and that the fall time is long. The time constant for the fall time can be easily varied.

Consequently, operations of the peak meter comprising the semiconductor device 1 of FIG. 7 is substantially the same as those of the peak meter comprising the semiconductor device 1 of FIG. 1.

In all of the above embodiments, the conductivity type of the semiconductive region may be reversed, where the polarities of the applied signal and the power source are reversed.

Although illustrative embodiments of the invention have been described in detail herein with reference to the accompanying drawings, it is to be understood that the invention is not limited to those precise embodiments, and that various changes and modifications may be effected therein without departing from the scope or spirit of the invention as defined in the appended claims.

What is claimed is:

1. A peak level indicator comprising:
   a. a charge storage semiconductor device including a semiconductive substrate with a current path portion, first and second semiconductive regions forming a PN junction therebetween, said first region being capacitively coupled to said current path portion, and a control electrode connected to said second region;
   b. means for applying a current through said current path portion;
   c. an indicating means for indicating said current through said current path portion; and
   d. means for applying an input signal to said control electrode.

2. A peak level indicator according to claim 1, wherein a PN junction is formed between said first region and said semiconductive substrate.

3. A peak level indicator according to claim 1, wherein said input signal applying means includes a rectifying means.

4. A peak level indicator according to claim 1, wherein said semiconductor device has a third semiconductive region forming a PN junction with said semiconductive substrate and a current supplying means is connected to said third region.

5. A peak level indicator according to claim 1, further including another semiconductor device connected to said first region of said charge storage semiconductor device.

6. A peak level indicator according to claim 5, wherein said semiconductor device is a field effect transistor.

7. A peak level indicator adapted for utilizing a charge storage semiconductor device in an integrated circuit comprising:
   a. a charge storage junction semiconductor device having a charge storing PN junction, an input, and an output;
   b. a rectifying signal input means connected to said charge storage device input;
   c. current means connected to said output of the charge storage semiconductor device for producing a current which is controlled by said charge storage semiconductor device; and
   d. indicating means connected to said current means for displaying a current of said current means.

8. A peak level indicator of claim 7 in which a discharge means connects with said charge storage junction semiconductor device for controlling a rate of discharge of said charge storing PN junction.

9. A peak level indicator of claim 8 in which said charge storage junction semiconductor device comprises a charge storage field effect transistor having a channel protion, source and drain electrodes connected at opposite ends of said channel portion, and first and second semiconductor regions forming a PN junction, said first region being capacitively coupled to said channel portion and a control electrode attached to said second region, said rectifying signal input means comprising a full wave rectifier connected to said gate electrode, said current means comprising a power source and impedance connected in series between said drain and source electrodes, and said indicating means comprising a meter connected between said drain and source electrodes.

10. A peak level indicator of claim 9 in which said discharge means comprises a current source connected to a third semiconductor region interfaced with said channel region and forming a PN junction at said interface.

11. A peak level indicator of claim 9 in which said discharge means comprises a junction field effect transistor having a drain-source current path connected to an electrode in contact with said capacitively coupled first semiconductor region.

12. A peak level indicator of claim 8 in which said charge storage junction semiconductor device comprises a charge storage diode having first and second semiconductor regions forming a PN junction, said first region being capacitively coupled to a third semiconductor region, an electrode being connected to each of said first and second regions, said rectifying signal input means comprising a full wave rectifier connected to said second region electrode, said current means comprising a field effect transistor having a gate connected to said first region electrode and a drain-source channel portion connected to a power source and impedance in series and said indicating means comprising a meter connected across said drain-source FET portion.

13. A peak level indicator of claim 12 in which said discharge means comprises a fourth semiconductor region interfaced with said third semiconductor region to form a PN junction therewith and a current source connected to said fourth region.

* * * * *